United States Patent [19]

Rajkanan et al.

[11] Patent Number: 4,521,796

[45] Date of Patent: Jun. 4, 1985

[54] MEMORY IMPLANT PROFILE FOR IMPROVED CHANNEL SHIELDING IN ELECTRICALLY ALTERABLE READ ONLY MEMORY SEMICONDUCTOR DEVICE

[75] Inventors: Kamal Rajkanan, Melville; Jagir S. Multani, Dix Hills, both of N.Y.

[73] Assignee: General Instrument Corporation, New York, N.Y.

[21] Appl. No.: 550,725

[22] Filed: Nov. 14, 1983

Related U.S. Application Data

[63] Continuation of Ser. No. 215,224, Dec. 11, 1980, abandoned.

[51] Int. Cl.³ .............................................. H01L 29/78
[52] U.S. Cl. .................. 357/23.5; 357/23.12; 357/54; 357/91; 365/184
[58] Field of Search ............ 357/23 VT, 23 D, 54, 357/91; 365/184

[56] References Cited

U.S. PATENT DOCUMENTS

| | | | |
|---|---|---|---|
| 3,912,545 | 10/1975 | Armstrong | 357/23 |
| 4,016,588 | 4/1977 | Ohya et al. | 357/23 |
| 4,017,888 | 4/1977 | Christie et al. | 357/23 |
| 4,052,229 | 10/1977 | Pashley | 357/23 |
| 4,101,921 | 7/1978 | Shimada et al. | 357/23 VT |
| 4,151,538 | 4/1979 | Polinsky et al. | 357/23.5 |
| 4,198,252 | 4/1980 | Hsu | 357/23 |
| 4,307,411 | 12/1981 | Carnes et al. | 357/23.5 |
| 4,353,083 | 10/1982 | Trudel et al. | 357/23.5 |

FOREIGN PATENT DOCUMENTS 2812049 9/1979 Fed. Rep. of Germany ........ 357/23 VT

OTHER PUBLICATIONS

G. Schottky, "Decrease of FET ... Oxidation," S—S Electr., vol. 14, pp. 467-474, 1971.

Primary Examiner—Joseph E. Clawson, Jr.
Attorney, Agent, or Firm—Allan J. Jacobson

[57] ABSTRACT

An Electrically Alterable Read Only Memory device including at least one cell in a substrate having source and drain channels with a memory gate region therebetween with the substrate in the memory gate region having therein a first impurity material of a first conductivity type to establish a desired write threshold voltage and a second impurity material of a second conductivity type opposite to said first type to tailor the surface concentration profiles of the impurity material in the memory gate region of the substrate.

14 Claims, 8 Drawing Figures

MEMORY IMPLANT PROFILE FOR IMPROVED CHANNEL SHIELDING IN ELECTRICALLY ALTERABLE READ ONLY MEMORY SEMICONDUCTOR DEVICE

This is a continuation of application Ser. No. 06/215,224, filed Dec. 11, 1980, now abandoned.

BACKGROUND OF THE INVENTION

An Electrically Alterable Read Only Memory (EAROM) is used as programmable non-volatile semiconductor memory device. Such memory devices in the form of individual memory cells of metal nitride-oxide semiconductor (MNOS) construction, have source and drain regions and a memory gate region formed by an interface of insulating materials, for example, silicon dioxide and silicon nitride. EAROM devices can be laid down as part of an integrated circuit (IC) chip in predetermined patterns or arrays, with high density at a relatively low cost.

The IC also contains logic, addressing and decoding circuits for selecting groups of cells, with each group generally considered to constitute a word, or to select individual cells. EAROMs require low power and are relatively simple to erase and write into by applying appropriate voltages to the gate electrodes of the memory cells. They have found widespread use in a variety of applications, for example, radio and television tuners, program storage circuits, etc.

In EAROM devices of this type, each cell is isolated from the next so that any cell can be selected and read, written or erased without affecting another cell. Such isolation is often provided by using channel stops between adjacent groups of cells. A channel stop is an area on the substrate of the semiconductor device between adjacent cells with a high threshold voltage to prevent undesired communication between unrelated source-drain diffusion regions. This can be done by having a thick insulating material over a heavily doped substrate region between two unrelated source-drain diffusion regions. For example, in N-channel devices, the channel stops would be P+ type material, with a thick field insulation. However, even such techniques as channel stops do not fully solve the isolation problem in memory devices where the neighboring memory cells (bits) also have to be shielded from the write operations being performed on one of the neighboring bits.

In EAROM devices, channel shielding is defined as the ability to selectively write some of the desired memory cells from the erased state without affecting the other erased cells. In other words, it is the ability of write protecting an erased bit while the other neighboring bits are being written. Good channel shielding is both necessary and desirable for large, high density, memory structures. It is desirable to maintain good channel shielding throughout as many erase-write cycles as possible since this enhances the utility of the device.

In the channel shield mode, the source and drains (columns) of the unselected erased bit (bit which has to be channel shielded from the neighboring bits) are precharged to write voltage (about +25V for N-channel EAROMS). The gate (word line) is also raised to the write voltage and the substrate is at ground potential. Thus, the source, drain and gate are at the same potential, with source and drain junctions being reverse biased. The gate electrode current which otherwise would have been used to write this particular bit, is now substantially shunted by the reverse biased source and drain. Except due to some residual gate to substrate current, this particular bit would not be written. The smaller the amount of this residual gate current, the better is the channel shielding. As the erase-write operation is repeated, the effect of this residual current accumulates and the bit eventually loses its original erased state. Therefore, the time and the number of erase-write cycles effect the channel shielding. It is desirable to reduce the residual gate current in the channel shield mode and thus increase the number of erase-write cycles for which the channel shielding would be effective.

SUMMARY OF THE INVENTION

The present invention relates to an EAROM and, more particularly, to an improved EAROM of the metal-nitride-oxide semiconductor (MNOS) type. The EAROM has improved channel shielding in the ability to be switched through erase-write cycle for a greater number of times than prior EAROM devices.

According to the invention, to reduce the inherent tendency of the memory cells changing from the erased state to the written state while the neighboring memory cells are being written, that is, to increase the channel shielding, the memory gate field is reduced by properly tailoring the implant profile under the memory gate channel. The tailoring is such that it provides a substantially low surface doping concentration for reducing the gate field while keeping the threshold voltage of the cells substantially constant. This is accomplished, according to a preferred embodiment of the present invention, by a double implantation of different impurity materials in the memory gate channel. There is first an implant of a suitable material, such as boron, in an N channel type device, to establish the gate threshold voltage, i.e., the voltage at which the device will switch from one state to another. There is a second implant of an impurity material of opposite conductivity type, for example, phosphorous for an N-channel device. This reduces the surface concentration produced by the original impurity material and also reduces the field under the gate without substantially changing the threshold voltage. The reduced field, increases the channel shielding by decreasing the ability of the charges to move within the gate dielectric, and therefore decreasing the gate to substrate current which is the primary cause of poor channel shielding.

OBJECTS OF THE INVENTION

It is, therefore, an object of the present invention to provide an EAROM device with improved channel shielding.

An additional object is to provide an EAROM in which the implant profile under the memory gate is tailored to reduce the gate field.

A further object is to provide an EAROM with improved channel shielding in which the implant profile under the memory gate is doubly implanted with suitable impurity materials to tailor the implant profile.

Yet another object is to provide an improved N channel EAROM in which the profile under the memory gate is doubly implanted with boron and phosphorous.

These and other objects of the present invention will become more apparent upon reference to the following specification and annexed drawings in which:

DETAILED DESCRIPTION

Figure 1:
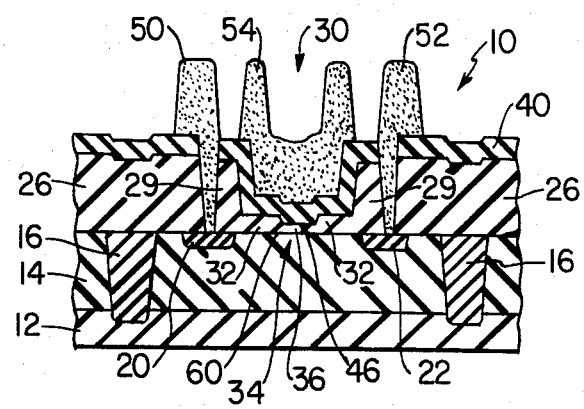
FIG. 1 is an elevational view in cross section of a cell of a completed split gate type EAROM in accordance with the invention.

Referring to FIG. 1, there is shown a cross section of a typical completed EAROM split gate memory cell 10 in accordance with the invention. The cell is shown greatly enlarged and is not drawn to scale. Only one memory cell is being described. It should be understood that a number of such cells, which are usually arranged in groups or words, are formed at the same time, as is conventional in semiconductor manufacture, together with the various other semiconductor circuits for logic, decoding and addressing. These are not shown since they do not form part of the invention.

The EAROM cell 10 is illustrative of the N-MNOS type although a P-MNOS device also can be made. It includes a substrate 12 of a suitable material, for example, silicon, which has been suitably doped with an N-type impurity, for example, arsenic. Substrate 12 provides support for an epitaxial layer 14 which is grown thereon and which includes a P-type impurity material, for example, boron. The impurity level in layer 14 can be, for example, in the order of approximately $1 \times 10^{15}$ atoms/cm$^3$ to about $1 \times 10^{16}$ atoms/cm$^3$. The cell may be demarcated by isolation diffusions 16 on each side which are diffused through the epitaxial layer 14 into the substrate. The isolation diffusions are N-type impurity regions.

A pair of junction regions 20, 22 are formed such as by diffusion in the substrate epitaxial layer 14 to form the source and drain. Both junction regions 20 and 22 are doped with an N-type impurity. The processes for forming the diffusion zones 20 and 22 are well known in the art and any conventional processing can be used, for example, ion implantation. The source and drain diffusion channels can be, for example, ion implanted arsenic/phosphorous having an impurity level in the order of about $10^{19}$ atoms/cm$^3$ to about $10^{21}$ atoms/cm$^3$.

An area of thick insulating material 26, called the field oxide and which can be, for example, silicon dioxide of several thousand Angstroms in thickness, is formed on the upper surface of the substrate epitaxial layer 14 to the outer edge of each of the diffusion regions 20, 22. This insulates one memory cell from the next and forms the channel stop regions. Openings are provided through the field oxide layer 26 for respective electrodes 50 and 52 to make electrical contact with the source and drain 20, 22. The electrodes 50, 52 can be of any suitable material, for example, aluminum.

The cell's memory gate region 30 is located between two vertical barriers 29 of the field oxide layer 26. Region 30 has on each side thereof a split gate area 32 of insulating material such as silicon dioxide, called the gate oxide, of a few hundred Angstroms thickness. Between the two split gate oxide areas 32, is the tunnelling region 34 on which is located the tunnelling gate layer 36 of insulating material, also such as silicon dioxide (SiO$_2$). The relative thicknesses of the non-tunnelling split gates 32 and the tunneling layer 36 is, for example, from about 400Å to about 600Å for the former and from about 10Å to about 40Å for the latter. These thicknesses control the switching and memory retentivity characteristics of the device.

A layer 40 of insulating material, such as silicon nitride (Si$_3$N$_4$) is provided on top of the field oxide layer 26 beneath the source and drain electrodes 50, 52 and in the memory cell area 30 over the split gate areas 32 and the tunnelling region 34. The nitride layer has a thickness in the range of from about 300Å to about 600A. Because of the crystal structures of SiO$_2$ and Si$_3$N$_4$, a charge storage area is formed at the interface 46 of the tunnelling gate region layer 36 and the nitride layer 40. The charge storage area also extends for a distance into the nitride layer 40. To complete the structure, a gate electrode 54, which can be of aluminum, is deposited on top of the nitride layer 40 in the memory cell area.

There is implanted in epitaxial layer 14 in the gate area between the source and drain channels 20, 22 an impurity concentration of materials of opposite conductivity type. These are, for example, in an N-channel device, boron as one material and phosphorous or arsenic as the second. The implant dose and energy of boron will govern the threshold voltage in N-channel devices, while the phosphorous or arsenic implant is used to improve channel shielding. The double implantation of impurities reduces the field in the gate area and thereby improves the channel sheilding. This is explained below.

In the overall operation of the EAROM of FIG. 1, consider that the drain and source are at ground potential. If a voltage of the proper magnitude and polarity is applied to the gate electrode 54, charges of the opposite polarity will be attracted from the epitaxial layer of the substrate. For example, a negative voltage applied to the gate electrode 54 causes positive charge carriers (holes) from the substrate 16 to tunnel through the silicon dioxide tunneling layer 36 and be trapped at the interface 46 and for a distance into the nitride layer. Since silicon dioxide - silicon nitride are extremely high quality insulators, the charge remains trapped for an extremely long period of time.

The N-channel EAROM is "written" into the low conduction state (or turned "off") by the application of a positive voltage for example +25 volts to the gate electrode 54. This effectively causes negative charges to be stored at silicon dioxide-silicon nitride interface. This negative charge moves the device threshold to a more positive level. In the "written" state, the EAROM operates in the enhancement mode, i.e. a positive voltage must be applied to the gate to establish a conduction channel between source and drain. A typical written state threshold for an N-channel EAROM is around 6 volts.

The device is erased into a low threshold, or high conduction, state by the application of a negative voltage (e.g. -25 volts) to the gate electrode 54. This negative voltage attracts positive charges (holes) to the interface 46, which in turn establishes a conduction channel under the memory gate 36. In the erased state, the region under the memory gate 36 acts in the depletion mode and therefore the two non-memory areas 32, which act as enhancement devices, are connected in series.

The erase state threshold is, therefore, determined by the thickness of the gate in the non-memory area 32 of the memory cell. The erased state threshold voltage can be in the order of 1.5 volts. The fairly large difference, or window, between the written and erased threshold voltages permits reliable data decoding.

It is known to control the threshold voltage $V_T$ at which the device switches from one state (on/off) to another state (off/on) by implanting an appropriate impurity into the silicon under the gate area. For example, in an N-channel device increasing the boron implantation moves the device more into the enhancement mode, i.e., the threshold becomes more positive. In a P-channel devices, boron has the reverse effect, i.e., an increase of the boron dose can make a P channel device charge from an enhancement mode to a depletion mode device (threshold becomes less positive and eventually negative).

Figure 2:
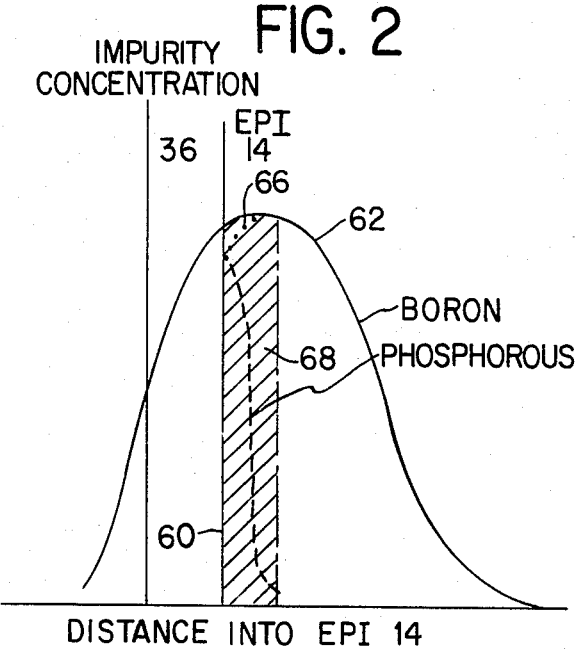
FIG. 2 is a graph showing the effect on the surface concentration of the impurities brought about by the double implantation.

Referring to FIG. 2, a graph is shown plotting the impurity concentration on the vertical axis as a function of distance into the device substrate with the vertical line indicating the interface 60 between the silicon dioxide memory gate layer 36 and the substrate epitaxial layer 14 of silicon.

Solid line curve 62 shows concentration of impurities by a boron implantation under the memory gate of N-channel EAROM. As should be noted, the peak of the boron impurity concentration is slightly below the interface 60.

In the channel shield mode, the gate and drain of the erased memory transistor is biased with write voltage approximately +25 volts for N-EAROMS and the source is floated. Since the erased N-channel memory gate area 36, is a depletion device and the enhancement non-memory gate regions 32, would be turned on due to +25V, therefore, when the gate and drain are biased at +25 volts, the source also floats to +25 volts. This means that the source and drain are reversed biased with respect to the substrate and the source-gate-drain are at equal potential.

While it would be first thought that the erased state should be preserved as source, gate and drain are at the same potential, the electric field in the memory gate region which terminates at the inversion layer in silicon causes reshuffling of the charges within the nitride layer. Because the gate is positively biased with respect to the silicon, the holes trapped at the silicon dioxide-nitride interface (remembering that the device is in the erased state) can be injected into silicon and the electrons from the inversion layer can be injected into the memory interface.

Over a period of time the device could be eventually written due to such charge movement and thus posing the channel shielding problem. To reduce this problem, the electric field in the memory state which causes the charge movement should be as low as possible. This can be achieved by lowering the surface concentration of dopant in silicon. However, if the surface doping is reduced arbitrarily, the erase-write window will be narrower for split gate devices, thereby giving rise to potential problems in erasing-writing. This is not desirable. The object is to keep the thresholds to the same values and yet achieve higher channel shield.

In general, channel shielding depends on the thickness of the nitride layer 40 and the surface concentration of impurities in silicon 14. The higher the impurity concentration at the surface of the epitaxial layer, the greater the field intensity and the easier it is for the charges to migrate from the nitride layer to reverse the erased state. It is, therefore, desired that the maximum point of concentration of the impurities be shifted to a point further below the interface 60. To do this, an impurity of opposite conductivity, for example, phosphorous, is also implanted very near to the Si-SiO$_2$ interface 60. The phosphorous acts in the opposite direction to the boron from the point of view of electrical conductivity. Effectively, it shifts the peak of surface impurity concentration further to the right, that is, further into the epitaxial layer, making the surface concentration of the impurities low at the surface. The two impurity concentrations are subtractive rather than additive and form the curve 66 rather than 62, that is, the surface concentration is lowered at the interface.

The additional shallow implantation of phosphorous does not change to any great extent the width of the depletion layer, which is shown by the cross hatched section 68. Therefore, the threshold voltage $V_T$ stays substantially the same and the threshold voltage window also stays fairly constant.

In essence, the use of phosphorous compensates the boron at the surface. The electrical field between the gate and silicon depends upon the impurity surface concentration. Since the surface concentration is decreased, the electric field is also decreased, and hence it improves the channel shielding as explained before.

FIGS. 3A–3F show the device in its various stages of manufacture. The N impurity substrate 12 provides mechanical rigidity for an epitaxial grown substrate layer of P-type material 14, in which is grown, by diffusion the isolating channel stops 16 of N-type material. There is grown, such as by a conventional oxidation techniques, a layer of silicon dioxide 19 across the entire surface of the epitaxial layer 14.

There is next placed in the layer 14 by a suitable diffusion process, the source and drain regions, 20 and 22. This is done through the oxide layer 19 in a conventional manner. The source and drain regions 20 and 22 are N impurity material.

Figure 3A:
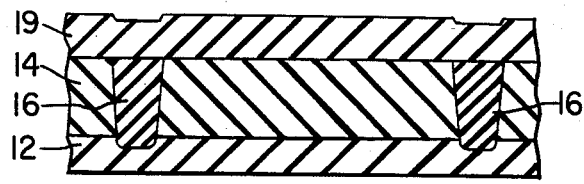
FIGS. 3A-3F show a split-gate type EAROM at various stages of its manufacture.
Figure 3B:
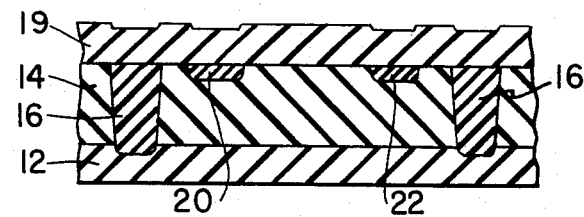
Figure 3C:
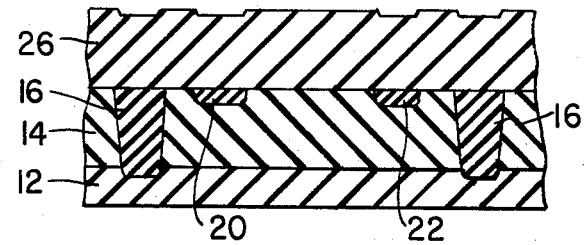

As shown in FIG. 3C, there is deposited another oxide layer on the upper surface of the previous oxide to make the field oxide layer 26. This is done by a pyrolytic reaction in a conventional manner. The field oxide layer is of a sufficient thickness, for example, about 1–2 microns.

Figure 3D:
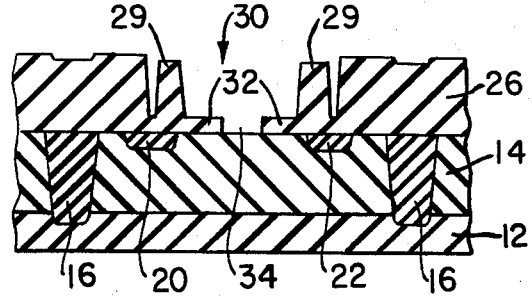
Figure 3E:
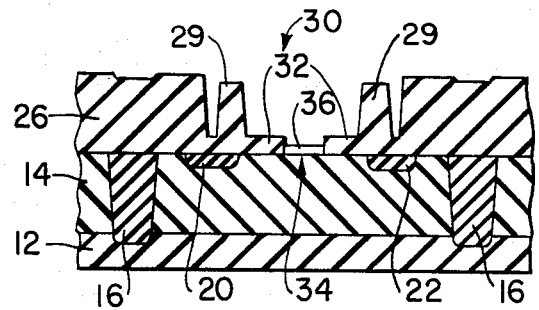
Figure 3F:
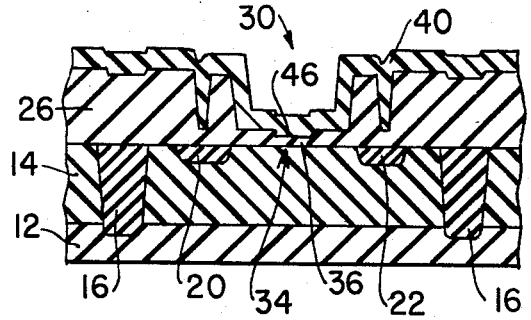

As shown in FIG. 3D, the field oxide layer 26 is etched to form the vertically upstanding walls 29 which define the memory cell region 30. In the etched region 30, the gate oxide 32, of about 400–600Å is thermally grown. The memory area 34 is then defined by photolithographic techniques.

The implantation of the impurities takes place in the regions 30 and 34, with the implantation in the region 34 being the most important as it controls the memory characteristics and channel shielding properties. This is done, for example, by ion implantation. Typical implantation doses are:

Boron: $5.5 \times 10^{12} \text{cm}^{-2}$ at 35 KeV typical
Phosphorous: $1.7 \times 10^{12} \text{cm}^{-2}$ at 80 KeV typical The area 34 is now etched down to the surface of the epitaxial layer 14 to form the tunnelling area of the memory gate region.

There is then grown in the tunnelling area 34 a layer of silicon dioxide 36 of thickness in the range of 10–40Å. This is grown by thermal reaction of oxygen with the silicon substrate. This can be done at atmospheric pressure or, in order to improve the memory characteristics of the device, the tunnel oxide layer can be grown by low pressure oxidation reaction. This is described in copending application Ser. No. 120,791, filed Feb. 12, 1980, which is assigned to the same assignee.

The layer of silicon nitride 40 is next deposited over the entire device. This is preferably done by a chemical vapor deposition technique. In a preferred manner, ammonia gas (NH$_3$) is flowed into a furnace at a low rate and pressure and together with another gas, such as dichlorosilane (SiH$_2$Cl$_2$). The flow of amonia and dichlorosilane gases is carried out until the nitride layer reaches the desired thickness. This can be, for example, anywhere from 300Å to 600Å. The ratio of ammonia to silane can be in the range of about 50:1.

Deposition of the nitride layer 40 forms the interface 46 in the memory channel area between the tunnelling gate region silicon dioxide layer 34 and the nitride 40. The tunnelling through the thin oxide layer 34, followed by charge storage at interface 46 produces the memory properties, as previously described.

FIG. 1, previously described, shows the completed device. The intermediate steps of etching out the contact holes 28 through the nitride and oxide layers, to the source and drain regions, have been omitted. To complete the device the metal electrodes 50 and 52 for the source and drain 20 and 22 and the electrode 54 for the memory gate area 34, are then deposited, for example, by a suitable vaporization technique, and defined by a photolithographic technique.

The use of the double implantation of impurities increases the channel shielding ability of the EAROM as compared to devices wherein only a single implantation has been carried out.

The invention has been described with respect to a split gate type of EAROM device. It also can be used in a flat gate device. In the flat gate device, there is no split gate regions 32. Instead, the memory channel region extends for the entire area 30 between the vertical walls 29.

The invention has also been described with respect to an N channel EAROM. In a P channel device, if the same effect is to be achieved, then the main impurity concentration to control V$_T$ would be either, for example, phosphorous or arsenic. To shift the concentration peak, boron, for example, would be utilized.

What is claimed is:

1. An electrically alterable read only memory semiconductor device comprising:
    a substrate of a material of a first conductivity type,
    source and drain regions of a second conductivity type in said substrate,
    a memory gate region between said source and drain including two superimposed layers of insulating material on said substrate in said memory gate region, electrical charges capable of being stored at the interface of said two layers, electrodes connected to said source, drain and the upper layer of insulating material of said gate region, and
    the substrate in said memory gate region having therein a first impurity material of a first conductivity type forming a first region of said first conductivity type having a higher conductivity than said substrate, and a second impurity material of a second conductivity type opposite to said first type forming a second region of said first conductivity type disposed between said first region and the surface of said substrate, said second region having a lower conductivity than said first region to tailor the surface concentration profile of the impurity material in the memory gate region of the substrate.

2. The device of claim 1 wherein said two superposed layers comprise a layer of silicon dioxide on said substrate and a layer of silicon nitride on top of said layer of silicon dioxide.

3. The device of claim 1 wherein said first impurity type material dopes the substrate in said memory gate region to obtain a desired threshold voltage to place the device in the written state.

4. A device as in claim 3 wherein the conductivity type of said first impurity is opposite to that of the source and drain regions.

5. A device as in claim 4 wherein the conductivity type of said second impurity is the same as that of the source and drain regions.

6. The device of claim 1 wherein said substrate is of P type conductivity material and said source and drain are of N type conductivity material.

7. The device of claim 6 wherein said first impurity type material in the substrate of said memory gate region is of P type material and said second impurity type material is of N type.

8. The device of claim 7 wherein the substrate of said memory gate region is doped with boron as said first impurity type material.

9. The device of claim 8 wherein said second impurity type material is selected from the group consisting of phosphorous and arsenic.

10. The device of claim 7 wherein the boron is implanted in the substrate under the memory gate by ion implantation to obtain a desired written state threshold voltage.

11. The device of claim 10 wherein the boron impurity material is disposed in said substrate to a depth in the range from about 0.2 microns to 0.3 microns.

12. An electrically alterable read only memory semiconductor device comprising:
    a substrate of a material having P type conductivity,
    source and drain channels of N type conductivity in said substrate,
    a memory gate region between said source and drain including two superposed layers of insulating material on said substrate in said memory gate region, electrical charges capable of being stored at the interface of said two layers, electrodes connected to said source, drain and the upper layer of insulating material of said gate region,
    the substrate in said memory gate region having therein a P type impurity material wherein said P type impurity material is disposed in the substrate in said memory gate region to obtain a desired written state threshold voltage, and the substrate in said memory gate region further having therein an N type impurity material disposed in said substrate to a depth in the range from about 0.05 microns to 0.07 microns to tailor the surface concentration profile of the impurity material in said memory gate region of the substrate.

13. The device of claim 12 wherein said P type impurity material is boron.

14. The device claim 12 wherein said N type impurity material is phosphorous.

* * * * *